(12) United States Patent
Shiokawa et al.

(10) Patent No.: US 11,222,919 B2
(45) Date of Patent: Jan. 11, 2022

(54) SPIN CURRENT MAGNETIZATION ROTATIONAL ELEMENT, SPIN-ORBIT TORQUE MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP);
Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/840,377

(22) Filed: Dec. 13, 2017

(65) Prior Publication Data

US 2019/0088711 A1 Mar. 21, 2019

(30) Foreign Application Priority Data

Sep. 21, 2017 (JP) .............................. JP2017-181328

(51) Int. Cl.
| | |
|---|---|
| *H01L 27/22* | (2006.01) |
| *H01L 43/06* | (2006.01) |
| *G11C 11/16* | (2006.01) |
| *H01L 43/04* | (2006.01) |
| *H01F 10/32* | (2006.01) |

(Continued)

(52) U.S. Cl.
CPC .......... *H01L 27/222* (2013.01); *G11C 11/161* (2013.01); *G11C 11/18* (2013.01); *H01F 10/329* (2013.01); *H01F 10/3218* (2013.01); *H01F 10/3254* (2013.01); *H01L 43/04* (2013.01); *H01L 43/06* (2013.01); *H01L 43/065* (2013.01);

(Continued)

(58) Field of Classification Search
CPC ..... H01L 27/222; H01L 27/228; H01L 43/08; H01L 43/04; H01L 43/06; H01L 43/065; G11C 11/161
See application file for complete search history.

(56) References Cited

U.S. PATENT DOCUMENTS

2014/0312441 A1* 10/2014 Guo ................... H01L 43/04
257/427
2015/0200003 A1* 7/2015 Buhrman ............ G11C 11/18
365/158

(Continued)

FOREIGN PATENT DOCUMENTS

WO 2016/021468 A1 2/2016

OTHER PUBLICATIONS

Seo, Yeongkyo, et al. "Area-Efficient SOT-MRAM With a Schottky Diode". IEEE Electron Device Letters, vol. 37, No. 8, pp. 982-985, 2016.

(Continued)

*Primary Examiner* — Phat X Cao
(74) *Attorney, Agent, or Firm* — Oliff PLC

(57) ABSTRACT

A spin current magnetization rotational element includes: a spin-orbit torque wiring extending in a first direction; and a first ferromagnetic layer laminated in a second direction intersecting with the spin-orbit torque wiring, wherein the first ferromagnetic layer comprises a plurality of ferromagnetic constituent layers and at least one inserted layer sandwiched between adjacent ferromagnetic constituent layers, and polarities of spin Hall angles of two layers, which sandwich at least one of the ferromagnetic constituent layers among the plurality of the ferromagnetic constituent layers, differ.

20 Claims, 8 Drawing Sheets

(51) Int. Cl.
*G11C 11/18* (2006.01)
*H01L 43/08* (2006.01)

(52) U.S. Cl.
CPC .......... *H01L 43/08* (2013.01); *G11C 11/1675* (2013.01); *H01F 10/3272* (2013.01)

(56) References Cited

U.S. PATENT DOCUMENTS

| | | | |
|---|---|---|---|
| 2015/0348606 A1* | 12/2015 | Buhrman | G11C 11/1675 365/158 |
| 2016/0225423 A1* | 8/2016 | Naik | H01L 43/08 |
| 2017/0076770 A1* | 3/2017 | Daibou | G11C 11/161 |
| 2017/0222135 A1* | 8/2017 | Fukami | G11C 11/161 |
| 2019/0088711 A1 | 3/2019 | Shiokawa et al. | |

OTHER PUBLICATIONS

Miron, Ioan M., et al. "Perpendicular Switching of a Single Ferromagnetic Layer Induced By In-plane Current Injection". Nature, vol. 476, pp. 189-194, 2011.

T. Tanaka et al., "Intrinsic Spin Hall Effect and Orbital Hall Effect in 4d and 5d Transition Metals," Physical Review B 77, 165117, 2008 Edition, p. 165117-1-165117-16.

* cited by examiner

SPIN CURRENT MAGNETIZATION ROTATIONAL ELEMENT, SPIN-ORBIT TORQUE MAGNETORESISTANCE EFFECT ELEMENT, AND MAGNETIC MEMORY

BACKGROUND OF THE INVENTION

Technical Field

The present invention relates to a spin current magnetization rotational element, a spin-orbit torque magnetoresistance effect element, and a magnetic memory Priority is claimed on Japanese Patent Application No. 2017-18028, filed Sep. 21, 2017, the content of which is incorporated herein by reference.

Description of Related Art

As a magnetoresistance effect element, the giant magnetoresistance (GMR) element composed of a multilayer film of a ferromagnetic layer and a non-magnetic layer; and the tunneling magnetoresistance (TMR) element using an insulating layer (tunnel barrier layer, barrier layer) as the non-magnetic layer are known. In general, the TMR element has a higher element resistance and a higher magnetic resistance (MR) ratio than the GMR element. Therefore, attention is focused on TMR elements as elements for magnetic sensors, high frequency components, magnetic heads and nonvolatile random access memories (MRAM).

The MRAM reads and writes data by utilizing the characteristic that the element resistance of the TMR element varies when the directions of magnetization of the two ferromagnetic layers sandwiching the insulating layer are changed. As a writing method of MRAM, a method in which writing (magnetization inversion) is performed by utilizing a magnetic field generated by a current (magnetization reversal); and a method in which writing is performed by utilizing a spin transfer torque (STT) generated by applying a current in a laminating direction of a magnetoresistance effect element (magnetization reversal), are known.

Although the magnetization reversal of the TMR element using STT is efficient from the viewpoint of energy efficiency, the reversal current density for magnetization reversal is high. From the viewpoint of the long life of the TMR element, it is desirable that the reversal current density is low. This also applies to the GMR element.

In recent years, attention has been focused on magnetization reversal utilizing a pure spin current generated by spin-orbit interaction, which performs magnetization reversal by a mechanism different from that of STT (for example, I. M. Miron, K. Garello, G Gaudin, P.-J. Zermatten, M. V. Costache, S. Auffret, S. Bandiera, B. Rodmacq, A. Schuhl, and P. Gambardella, Nature, 476, 189 (2011)).

Although this mechanism has not been fully clarified yet, it is believed that the pure spin current generated by the spin-orbit interaction or the Rashba effect at the interface of dissimilar materials induces the spin-orbit torque (SOT), and magnetization reversal occurs due to SOT. Pure spin current is generated by the same number of upward spin electrons and downward spin electrons flowing in mutually opposite directions, and the flow of electric charges is canceled. Therefore, the current flowing through the magnetoresistance effect element is zero, and it is expected that the service life of the magnetoresistance effect element is extended by utilizing the characteristics.

For example, US Patent Application Publication No. 2014/0312441 describes a magnetoresistive memory that performs writing (magnetization reversal) utilizing SOT.

In the magnetoresistive memory described in US Patent Application Publication No. 2014/0312441, the magnetization of the functional magnetic coupling layer is reversed by utilizing the SOT due to the spin injected by the spin Hall effect; and the magnetization direction of the recording layer magnetically coupled to a functional magnetic coupling layer is reversed.

SUMMARY OF THE INVENTION

However, it is believed that the reversal current density necessary for reversing the magnetization by utilizing SOT is about the same as the reversal current density necessary for reversing the magnetization by utilizing STT. In an element utilizing SOT, there is no need to flow current in the lamination direction of the magnetoresistance effect element. Thus, there is an advantage that damage to the magnetoresistance effect elements can be suppressed. On the other hand, in order to increase the drive efficiency of the element, it is required to reduce the reversal current density necessary for reversing the magnetization by utilizing SOT.

The present invention has been made in view of the above circumstances, and it is an object of the present invention to provide a spin current magnetization rotational element, a spin-orbit torque magnetoresistance effect element, and a magnetic memory capable of reducing the reversal current density required for magnetization reversal.

SUMMARY OF THE INVENTION

The inventors of the present invention found that a portion of the current flowing along the spin-orbit torque wiring penetrates into the ferromagnetic metal layer in the SOT type magnetoresistance effect element having the spin-orbit torque wiring. Accordingly, they investigated generation of spin causing SOT in a larger quantity by inserting a layer for generating the spin Hall effect even in the ferromagnetic metal layer. By controlling the polarity of the spin Hall angle of the inserted layer, it was found that cancellation of SOT can be avoided or reduced.

The present invention provides the following aspects to solve the above-mentioned problems.

(1) A spin current magnetization rotational element of the first aspect of the present invention is a spin current magnetization rotational element including: a spin-orbit torque wiring extending in a first direction; and a first ferromagnetic layer laminated in a second direction intersecting with the spin-orbit torque wiring, wherein the first ferromagnetic layer comprises a plurality of ferromagnetic constituent layers and at least one inserted layer sandwiched between adjacent ferromagnetic constituent layers, and polarities of spin Hall angles of two layers, which sandwich at least one of the ferromagnetic constituent layers among the plurality of the ferromagnetic constituent layers, differ.

(2) In the above-described spin current magnetization rotational element of the first aspect of the present invention, one of the layers sandwiching the one of the ferromagnetic constituent layers may be the spin-orbit torque wiring and other of the layers sandwiching the one of the ferromagnetic constituent layers may be the inserted layer.

(3) In the above-described spin current magnetization rotational element of the first aspect of the present invention, the first ferromagnetic layer may include a plurality of inserted layers, and polarities of spin Hall angles of the spin-orbit torque wiring and the plurality of inserted layers may alternately differ in a lamination direction thereof.

(4) In the above-described spin current magnetization rotational element of the first aspect of the present invention, among the spin-orbit torque wiring; and the inserted layer or the plurality of inserted layers, a layer, which has a spin Hall angle of a positive polarity, may include a metal element belonging to any one of groups 8, 9, 10, 11 and 12 as a major component; and a layer, which has a spin Hall angle of a negative polarity, may include a metal element belonging to any one of groups 3, 4, 5, 6 and 7 as a major component (5) In the above-described spin current magnetization rotational element of the first aspect of the present invention, at least adjacent two ferromagnetic constituent layers may be antiferromagnetically coupled in the plurality of ferromagnetic constituent layers.

(6) In the above-described spin current magnetization rotational element of the first aspect of the present invention, a magnetization direction of the plurality of ferromagnetic constituent layers may be oriented to a third direction perpendicular to the first and second directions.

(7) In the above-described spin current magnetization rotational element of the first aspect of the present invention, among the plurality of ferromagnetic constituent layers, a ferromagnetic constituent layer closest to the spin-orbit torque wiring may be thinner than other ferromagnetic constituent layers.

(8) In the above-described spin current magnetization rotational element of the first aspect of the present invention, in the plurality of ferromagnetic constituent layers, a sum of products of saturation magnetizations and layer thicknesses of ferromagnetic constituent layers, magnetization directions of which are oriented in an identical direction, may equal to a sum of products of saturation magnetizations and layer thicknesses of ferromagnetic constituent layers, magnetization directions of which are oriented in an opposite direction.

(9) A spin-orbit torque magnetoresistance effect element of the second aspect of the present invention is a spin-orbit torque magnetoresistance effect element including: the spin current magnetization rotational element according to the above-described first aspect of the present invention; a non-magnetic layer laminated on a surface of the first ferromagnetic layer on an opposite side of a surface contacting the spin-orbit torque wiring; and a second ferromagnetic layer, the first ferromagnetic layer and the non-magnetic layer being sandwiched between the second ferromagnetic layer and the spin-orbit torque wiring.

(10) A magnetic memory of the third aspect of the present invention is a magnetic memory comprising a plurality of spin-orbit torque magnetoresistance effect elements according to the above-described second aspect of the present invention.

Effect of the Invention

It is possible to provide a spin current magnetization rotational element, a spin-orbit torque magnetoresistance effect element, and a magnetic memory capable of reducing the reversal current density required for magnetization rotation (reversal).

DETAILED DESCRIPTION OF THE INVENTION

Figure 1:
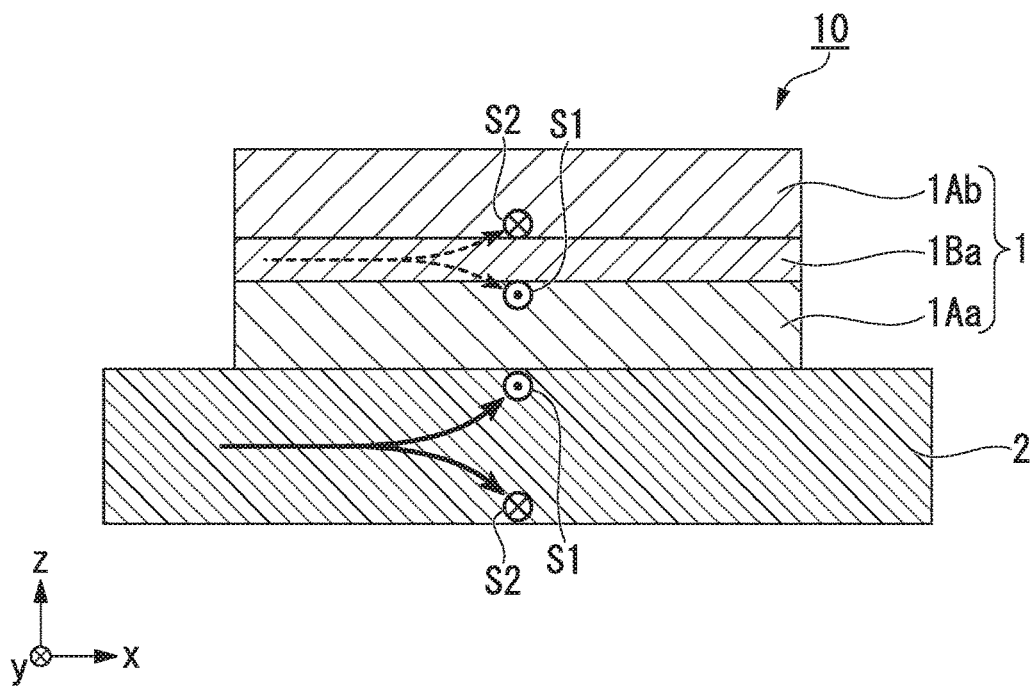
FIG. 1 is a cross-sectional view schematically showing a spin current magnetization rotational element according to the first embodiment.

Hereinafter, the present embodiment will be described in detail in reference to the drawings as needed. In the drawings used in the following description, for the sake of clarity, the characteristic portions are shown in an enlarged manner for the sake of convenience, and the dimensional ratios of the respective components may be different from the actual sometimes. The materials, dimensions, and the like exemplified in the following description are merely examples, and the present invention is not limited thereto, and can be carried out by appropriately changing within a range that exerts the effects of the present invention.

Spin Current Magnetization Rotational Element

First Embodiment

FIG. 1 is a cross-sectional view schematically showing a spin current magnetization rotational element according to the first embodiment. The spin current magnetization rotational element 10 according to the first embodiment includes the first ferromagnetic layer 1 and the spin-orbit torque line 2.

Hereinafter, the first direction in which the spin-orbit torque wiring 2 extends is taken as the x direction, the stacking direction (the second direction) of the first ferromagnetic layer 1 as the z direction, the direction perpendicular to both the x direction and the z direction is defined as the y direction.

<Spin-Orbit Torque Wiring>

The spin-orbit torque wiring 2 extends in the x direction. The spin-orbit torque wiring 2 is connected to one surface of the first ferromagnetic layer 1 in the z direction. The spin-orbit torque wiring 2 may be directly connected to the first ferromagnetic layer 1 or may be connected via another layer.

The spin-orbit torque wiring 2 is made of a material which generates a pure spin current by a spin Hall effect when current flows. The spin-orbit torque wire 2 is not limited to a material made of a single element, but may be composed of a part made of a material that is likely to generate a pure spin current and a part that is made of a material that is difficult to generate a pure spin current and the like.

The spin Hall effect is a phenomenon in which a pure spin current is induced in a direction orthogonal to the current direction based on the spin-orbit interaction when a current is passed through the material. The mechanism by which a pure spin current is generated by the spin Hall effect is explained below.

As shown in FIG. 1, when a potential difference is applied to both ends of the spin-orbit torque wiring 2 in the x direction, current flows along the x direction. When current flows, the first spin S1 oriented in the −y direction and the second spin S2 oriented in the +y direction are each bent in a direction orthogonal to the current. Although FIG. 1 illustrates that the first spin S1 is bent toward the first ferromagnetic layer 1, the bending direction may be reversed. That is, the first spin S1 may be bent in the −z direction and the second spin may be bent in the +z direction. The normal Hall effect and the spin Hall effect are common in that the movement (moving) electric charge (electron) is bent in the movement (moving) direction. On the other hand, in the normal Hall effect, charged particles moving in a magnetic field undergo Lorentz force to bend the direction of motion, whereas in the spin Hall effect the movement direction of spin is bend by only electrons moving (only with current flow) without the presence of magnetic field, which is the major difference between them.

Since the number of electrons in the first spin S1 is equal to the number of electrons in the second spin S2 in the non-magnetic material (material which is not ferromagnetic material), the number of electrons in the first spin S1 going upward in the figure and the number of electrons in the second spin S2 going downward in the fire are the same. Therefore, the current as a net flow of charge is zero. This spin current unassociated with current is called the pure spin current specifically.

When electric current is passed through the ferromagnetic material, the point that the first spin S1 and the second spin S2 are bent in opposite directions is the same as in the case of the non-magnetic material. On the other hand, in the ferromagnetic material, either one of the first spin S1 or the second spin S2 is in a state of being in excess. As a result, a net flow of charges occurs (voltage is generated). Therefore, as a material of the spin-orbit torque wire 2, a material consisting only of a ferromagnetic material is not included.

Here, the flow of electrons in the first spin S1 is defined as $J\uparrow$, the flow of electrons in the second spin S2 as $J\downarrow$, and the spin current as IS, it is defined by $JS=J\uparrow-J\downarrow$. The pure spin current JS flows in the z direction in the figure. Here, JS is a flow of electrons with a polarizability of 100%.

In FIG. 1, when a ferromagnetic material is brought into contact with the upper surface of the spin-orbit torque wiring 2, the pure spin current diffuses and flood into the ferromagnetic material. That is, spin is injected into the first ferromagnetic layer 1.

The spin-orbit torque wire 2 is made of any one of a metal, an alloy, an intermetallic compound, a metal boride, a metal carbide, a metal silicide, and a metal phosphide having the function of generating a pure spin current by the spin Hall effect when current flows.

It is preferable that the major component of the spin-orbit torque wiring 2 is a non-magnetic heavy metal. Here, the heavy metal means a metal having a specific gravity equal to or higher than yttrium. The non-magnetic heavy metal is preferably a non-magnetic metal having an atomic number of 39 or more and having d electrons or f electrons in the outermost shell. These non-magnetic metals have a large spin-orbit interaction that causes a spin Hall effect.

Normally, when electric current is passed through a metal, all the electrons move in the opposite direction to the current regardless of the direction of the spin. On the other hand, non-magnetic metals having d or f electrons in the outermost shell and a large atomic number have large spin-orbital interaction and strong spin Hall effect. Therefore, in the case of the non-magnetic metals having d or f electrons in the outermost shell and a large atomic number, the direction of movement of electrons depends on the direction of electron spin. In other words, these non-magnetic metals are likely to generate a pure spin current Js.

In addition, the spin-orbit torque wiring 2 may contain a magnetic metal. The magnetic metal means a ferromagnetic metal or an antiferromagnetic metal. If a small amount of magnetic metal is contained in the non-magnetic metal, it becomes a scattering factor of spin. If the spin is scattered, the spin-orbit interaction is enhanced and the spin current generation efficiency with respect to the current is increased. The major component of the spin-orbit torque wire 2 may be made of only an antiferromagnetic metal.

On the other hand, if the addition amount of the magnetic metal is excessively increased, the generated pure spin current is scattered by the added magnetic metal, and as a result the action of decreasing the spin current becomes strong in some cases. Therefore, the molar ratio of the added magnetic metal is preferably sufficiently smaller than the total molar ratio of the elements constituting the spin-orbit torque wiring. As a rule of thumb, the molar ratio of the added magnetic metal is preferably 3% or less.

In addition, the spin-orbit torque wiring 2 may include a topological insulator. The major component of the spin-orbit torque wiring 2 may be a topological insulator. The topological insulator is a material in which the interior of the material is an insulator or a high resistance body, but a spin-polarized metallic state is generated on the surface thereof. An internal magnetic field is generated in this material by the spin-orbit interaction. Therefore, even if there is no external magnetic field, a new topological phase develops due to the effect of the spin-orbit interaction. This is a topological insulator and it is possible to generate pure spin current with high efficiency by strong spin-orbital interaction and breaking of inversion symmetry at the edge.

As the topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$ and the like are preferable. These topological insulators are capable of generating spin current with high efficiency.

<First Ferromagnetic Layer>

The magnetization direction of the first ferromagnetic layer changes upon receipt of SOT due to spin injected from the spin-orbit torque line 2. The first ferromagnetic layer has a plurality of ferromagnetic constituent layers and at least one inserted layer sandwiched between adjacent ferromagnetic constituent layers. The first ferromagnetic layer 1 shown in FIG. 1 comprises two ferromagnetic constituent layers 1Aa, 1Ab and an inserted layer 1Ba sandwiched therebetween.

[Ferromagnetic Constituent Layer]

As a material of the ferromagnetic constituent layers 1Aa and 1Ab constituting the first ferromagnetic layer 1, a ferromagnetic material, particularly a soft magnetic material can be applied. For example, metals selected from the group consisting of Cr, Mn, Co, Fe and Ni; alloys containing at least one of these metals; alloys containing one of these metals and at least one element of B, C, and N; or the like can be used. Specifically, Co—Fe, Co—Fe—B, Ni—Fe can be named.

In order to obtain a higher output, a Heusler alloy such as $Co_2FeSi$ may be used for the ferromagnetic constituent layers 1Aa and 1Ab. The Heusler alloy contains an intermetallic compound having a chemical composition of $X_2YZ$, X is a transition metal element or a noble metal element of Co, Fe, Ni, or Cu group on the periodic table, Y is a transition metal element of Mn, V, Cr or Ti group or an elemental species of X, and Z is a typical element of group III to group V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like can be named.

The film thickness of the ferromagnetic constituent layers 1Aa and 1Ab are preferably 1.5 nm or less, more preferably 1.0 nm or less. When the film thicknesses of the ferromagnetic constituent layers 1Aa and 1Ab are made thin, at the interface between the ferromagnetic constituent layers 1Aa and 1Ab and the inserted layer 1Ba or the spin-orbit torque interconnect 2, the perpendicular magnetic anisotropy (interfacial perpendicular magnetic anisotropy) can be added. That is, the magnetization directions of the ferromagnetic constituent layers 1Aa and 1Ab can be made perpendicular to the laminated face. The effect of the interfacial perpendicular magnetic anisotropy is attenuated by thickening the film thickness of the ferromagnetic constituent layer.

In addition, if the film thickness of the ferromagnetic constituent layers 1Aa and 1Ab is thin, the reversal current density required for reversing the magnetizations of the ferromagnetic constituent layers 1Aa and 1Ab by SOT can be lowered. The reversal current density by SOT is proportional to the film thickness of the ferromagnetic metal layer.

Among the plurality of ferromagnetic constituent layers 1Aa and 1Ab, the ferromagnetic constituent layer 1Aa closest to the spin-orbit torque line 2 is preferably thinner than the other ferromagnetic constituent layers 1Ab. Although details will be described later, it is the spin-orbital torque wiring 2 and the inserted layer 1Ba that generate the spin current in the spin current magnetization rotational element 10. The amount of current flowing through the spin-orbit torque wiring 2 is larger than the amount of current flowing through the inserted layer 1Ba and the spin current generated in the spin-orbit torque wiring 2 is larger than the spin current generated in the inserted layer 1Ba. On the other hand, as described above, the reversal current density due to SOT is proportional to the film thickness of the ferromagnetic metal layer, and the layer with a low film thickness is easy to reverse magnetization. That is, it is possible to further reduce the reversal current density by making the layer into which the largest number of spins is injected thin and facilitating magnetization reversal.

[Inserted Layer]

The inserted layer 1Ba is a layer (spin current generation layer) for generating a spin current. In FIG. 1, the inserted layer 1Ba sandwiches (is provided on) the spin-orbit torque wire 2 and the ferromagnetic constituent layer 1Aa.

The polarity of the spin Hall angle of the inserted layer 1Ba is different from the polarity of the spin Hall angle of the spin-orbit torque wire 2. In the spin Hall effect, the first spin S1 and the second spin S2 are bent in opposite directions. The first spin S1 may be bent in the z direction or bent in the −z direction. This is the "polarity of spin Hall angle." It is defined as the positive polarity when bent in the z direction; and as the negative polarity when bent in the −z direction. The polarity of the spin Hall angle can be set according to the material species constituting the spin-orbit torque wire 2 and the inserted layer 1Ba, the type of added element, the amount of the added element, and the like.

The "spin Hall angle" is one of the indices of the strength of the spin Hall effect and indicates the conversion efficiency of the generated spin current with respect to the current flowing along the spin-orbit torque wiring 2. That is, the larger the absolute value of the spin Hall angle is, the more the first spin S1 or the second spin S2 is injected into the first ferromagnetic layer 1.

As the inserted layer 1Ba, a material similar to the material used for the spin-orbit torque wiring 2 can be used. Among these materials, a material which makes the spin-orbit torque wiring 2 and the polarity of the spin Hall angle different will be selected. For example, when the spin-orbit torque wiring 2 has a positive polarity spin Hall angle, the inserted layer 1Ba is made to mainly include a material having a negative polarity spin Hall angle.

In order to make the spin-orbit torque wiring 2 or the inserted layer 1Ba a layer having a positive polarity spin Hall angle, it is preferable to use a metal element belonging to any one of the group 8, 9, 10, 11 and 12, as the major component. In order to make the spin-orbit torque wiring 2 or the inserted layer 1Ba a layer having a negative spin-hole angle, it is preferable to use a metal element belonging to any one of the group 3, 4, 5, 6 and 7, as the major component. For example, when the spin-orbit torque wiring 2 mainly includes Ta and has a negative polarity spin Hall angle, the material mainly forming the inserted layer 1Ba is made of Ru having a positive spin Hall angle.

The thickness of the inserted layer 1Ba is preferably 0.3 nm to 2.0 nm. The thickness of less than 0.3 nm is the film thickness that cuts off one atomic layer. Therefore, it becomes difficult to produce a homogeneous layer. On the other hand, if the thickness exceeds 2.0 nm, the magnetic coupling between the ferromagnetic constituent layers 1Aa and 1Ab is broken, and there is concern that the first ferromagnetic layer 1 will not behave as one ferromagnetic material.

<Principle of Operation>

The operation principle of the spin current magnetization rotational element 10 according to the first embodiment will be described in reference to FIG. 1. When an electric current flows along the spin-orbit torque wiring 2, the first spin S1 and the second spin S2 are bent in opposite directions due to the spin Hall effect, and a spin current is generated. In the case where the spin-orbit torque wiring 2 has a positive polarity spin Hall angle, the first spin S1 is injected into the ferromagnetic constituent layer 1Aa of the first ferromagnetic layer 1.

Since the first ferromagnetic layer 1 is made of a metal, part of the current flowing through the spin-orbit torque wiring 2 penetrates into the first ferromagnetic layer 1. The intruded current flows along the inserted layer 1Ba. When an electric current flows along the inserted layer 1Ba, the first spin S1 and the second spin S2 are bent in opposite directions due to the spin Hall effect even in the inserted layer 1Ba, and a spin current is generated. The inserted layer 1Ba has the spin Hole angle of a polarity (eg, negative polarity) different from that of the spin-orbit torque wiring 2. Therefore, the first spin S1 and the second spin S2 in the inserted layer 1Ba are bent in opposite directions to the first spin S1 and the second spin S2 in the spin-orbit torque wiring 2. When the inserted layer 1Ba has a negative spin Hall angle, the first spin S1 is injected into the ferromagnetic constituent layer 1Aa and the second spin S2 is injected into the ferromagnetic constituent layer 1Ab.

That is, as shown in FIG. 1, the first spin S1 is injected from the spin-orbit torque wiring 2 and the inserted layer 1Ba into the ferromagnetic constituent layer 1Aa. When the amount of spin injected into the ferromagnetic constituent layer 1Aa increases, a large SOT acts on the magnetization of the ferromagnetic constituent layer 1Aa, and the magnetization of the ferromagnetic constituent layer 1Aa easily reverses the magnetization. Since the ferromagnetic constituent layer 1Aa and the ferromagnetic constituent layer 1Ab are magnetically coupled, when the magnetization of the ferromagnetic constituent layer 1Aa is reversed, the magnetization of the ferromagnetic constituent layer 1Ab is also reversed.

Figure 2:
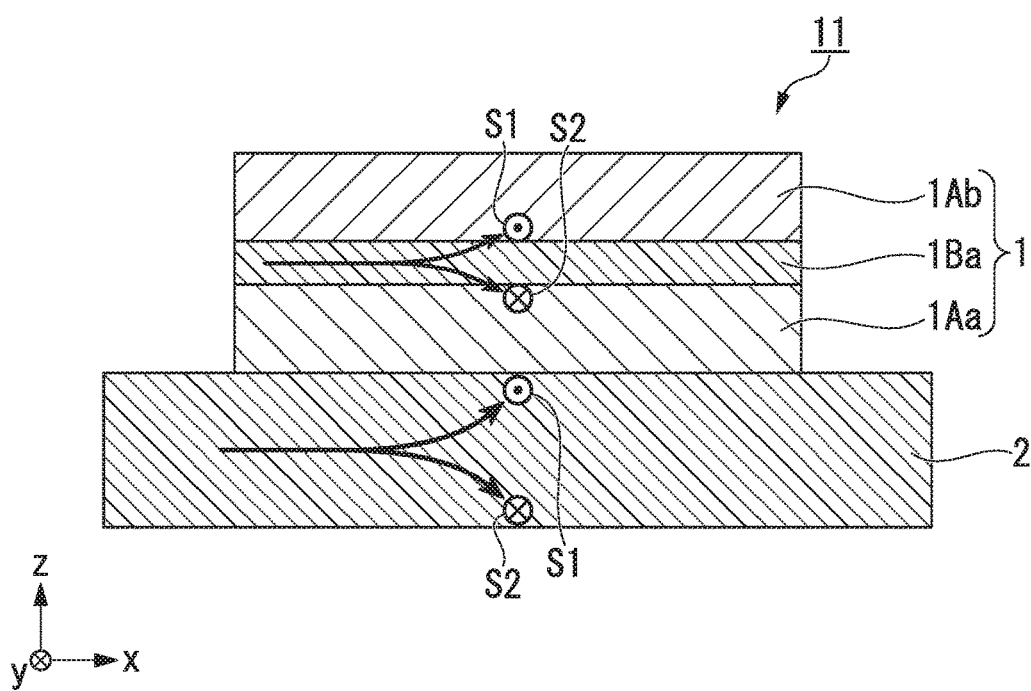
FIG. 2 is a schematic cross-sectional view of a spin current magnetization rotational element in which the spin-orbit torque wiring and the spin Hall angle of the inserted layer are the same in polarity.

On the other hand, FIG. 2 is a schematic cross-sectional view of the spin current magnetization rotational element 11 in which the spin-orbit torque wiring 2 and the inserted layer 1Ba have the same polarity of the spin Hall angle. When the polarities of the spin Hall angles are equal, the direction of the spin (for example, the first spin S1) injected from the spin-orbit torque wiring 2 to the ferromagnetic constituent layer 1Aa and the direction of the spin (for example, the second spin S1) injected from the inserted layer 1Ba The direction of the spin S2) are opposite. The direction of rotation in which the magnetization of the ferromagnetic constituent layer 1Aa is rotated by the SOT generated by the first spin S1 and the direction of rotation in which the magnetization of the ferromagnetic constituent layer 1Aa is rotated by SOT generated by the second spin S2 are opposite. That is, the forces cancel each other and impede efficient magnetization rotation (reversal).

As described above, in the spin current magnetization rotational element 10 according to the first embodiment, the magnetization of this ferromagnetic constituent layer can be efficiently reversed by sandwiching the ferromagnetic constituent layer 1Aa with the layers having different spin Hole angles. Moreover, since the other ferromagnetic constituent layers are magnetically coupled with this ferromagnetic constituent layer, the magnetization rotates (reverses) efficiently. As a result, the magnetization direction of the first ferromagnetic layer 1 as a whole changes efficiently. That is, according to the spin current magnetization rotational element 10 of the first embodiment, a large SOT can be expressed with a small amount of current, and the reversal current density can be lowered.

The discussion has been made solely on the basis of only increasing the amount of spin injected so far, but the difference of the magnetization reversal method will be explained based on the relation with the orientation direction of magnetization of the ferromagnetic constituent layers 1Aa and 1Ab.

The orientation of the magnetization direction of the ferromagnetic constituent layers 1Aa and 1Ab is roughly divided into a vertical orientation oriented in the z direction and an in-face orientation oriented in the xy plane. In addition, among the xy in-face orientations, there are two cases: one is oriented in the x direction orthogonal to the direction of the injected spin; and the other is oriented in the y direction parallel to the direction of the injected spin.

Figure 3A:
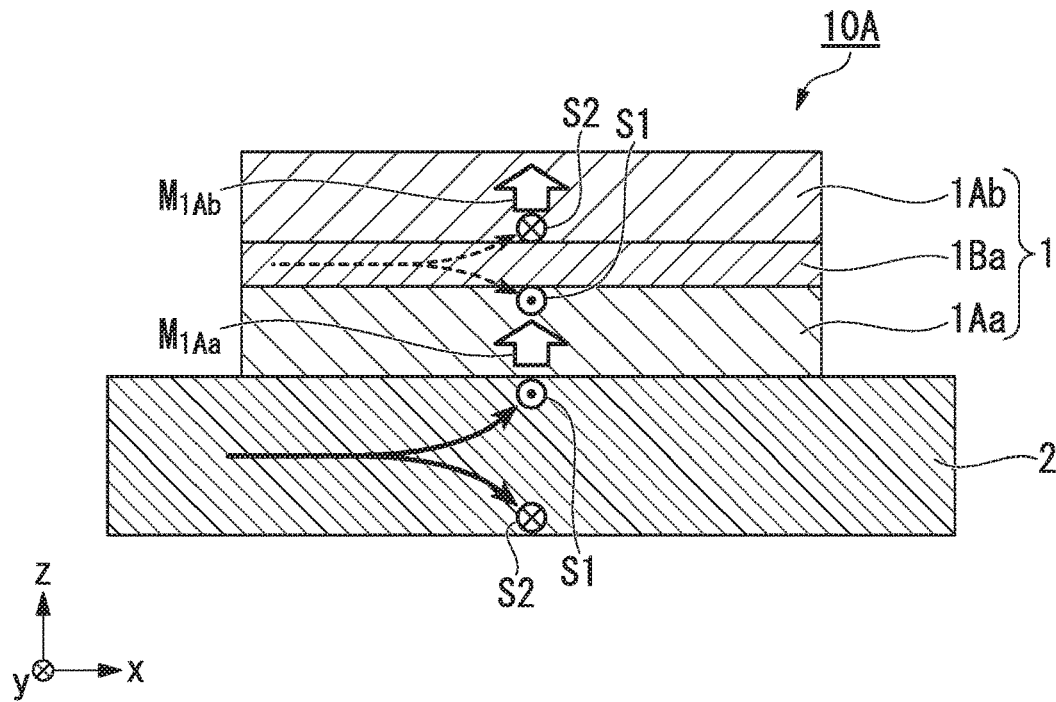
FIGS. 3A and 3B are diagrams schematically showing a spin current magnetization rotational element of an example in which the ferromagnetic constituent layers are a perpendicular magnetization film.
Figure 3B:
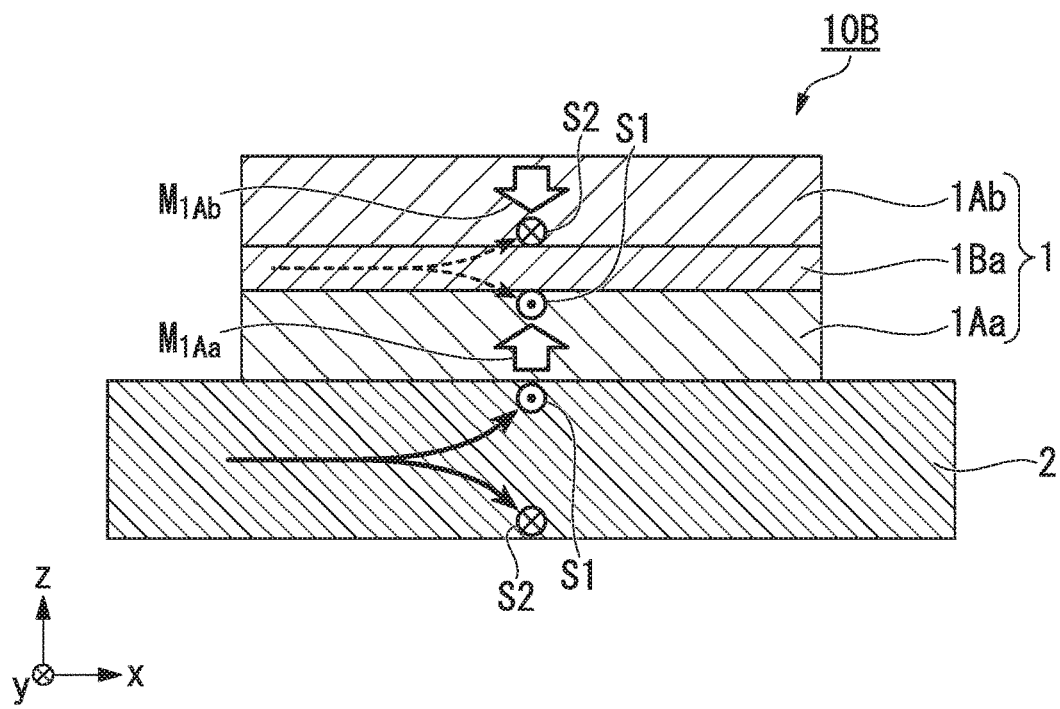

FIGS. 3A and 3B are diagrams schematically showing a spin current magnetization rotational element of the example in which the ferromagnetic constituent layers 1Aa and 1Ab are perpendicular magnetization films. In the spin current magnetization rotational element 10A shown in FIG. 3A, the ferromagnetic constituent layer 1Aa and the ferromagnetic constituent layer 1Ab are ferromagnetically coupled, and the spin current magnetization rotational element 10B shown in FIG. 3B, the ferromagnetic constituent layer 1Aa and the ferromagnetic constituent layer 1Ab are antiferromagnetically coupled.

In either FIG. 3A or 3B, the direction of the injected spin (±y direction) with respect to the orientation direction (z direction) of the magnetizations $M_{1Aa}$ and $M_{1Ab}$ of the ferromagnetic constituent layers 1Aa and 1Ab are perpendicular to each other. Therefore, the SOT due to the injected spin exerts a force of rotating the magnetizations $M_{1Aa}$, $M_{1Ab}$ by 90° in the ±y direction. The SOT receives a force rotating the magnetization $M_{1Aa}$ by 90° in the −y direction and the magnetization $M_{1Ab}$ receives the force rotating by 90° in the +y direction by the SOT. That is, even when the ferromagnetic constituent layer 1Aa and the ferromagnetic constituent layer 1Ab are ferromagnetically coupled or antiferromagnetically coupled, the SOT acts in the direction of collapsing the magnetizations $M_{1Aa}$ and $M_{1Ab}$ oriented in the z direction. The magnetization collapsed to 90° is reversed by the force of the magnetic field. The magnetic field described here may be a magnetic field applied from an external mechanism, an effective magnetic field generated from exchange coupling or shape magnetic anisotropy, or a leakage magnetic field from the reference layer.

In other words, there is no problem that the directions of the spins (the first spin S1) injected into the ferromagnetic constituent layer 1Aa and the spins (the second spin S2) injected into the ferromagnetic constituent layer 1Ab are opposite. The spin (the first spin S1) injected into the ferromagnetic constituent layer 1Aa generates a force to rotate the magnetization $M_{1Aa}$ in the −y direction to advance the magnetization reversal, and the spin (the first spin S1) generates a force to rotate the magnetization $M_{1Ab}$ in the +y direction and advances the magnetization rotation. This is irrespective of whether the ferromagnetic constituent layers 1Aa and 1Ab are ferromagnetically coupled or antiferromagnetically coupled.

Figure 4A:
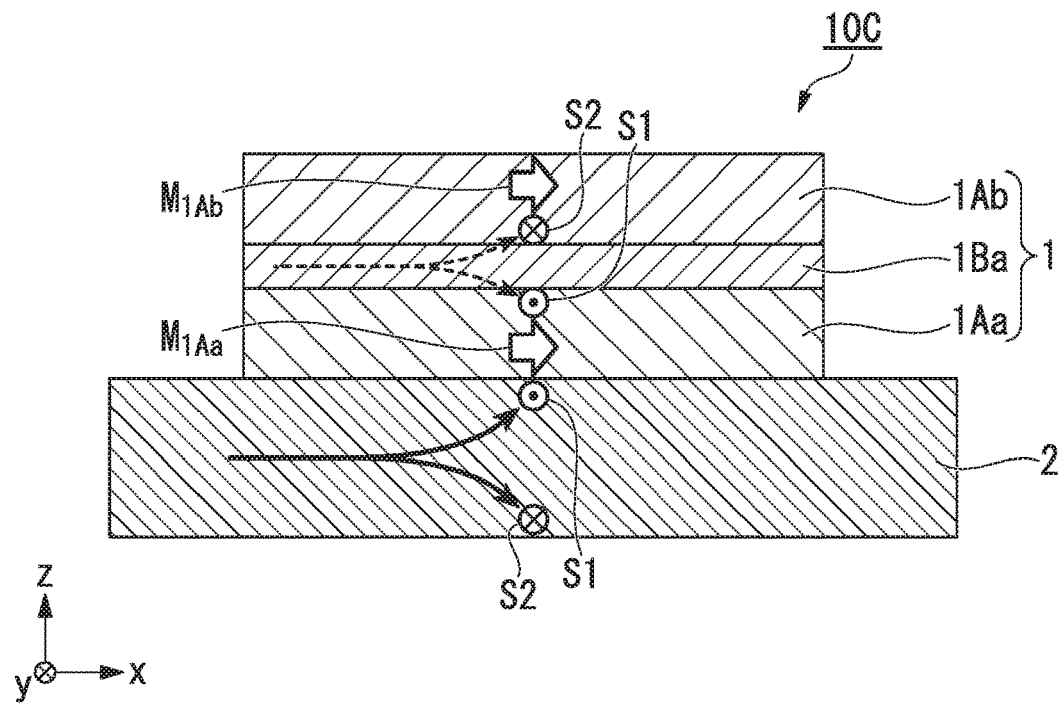
FIGS. 4A and 4B are diagrams schematically showing a spin current magnetization rotational element of an example in which the ferromagnetic constituent layers are an in-face magnetization film and the magnetization thereof is oriented in the x direction.
Figure 4B:
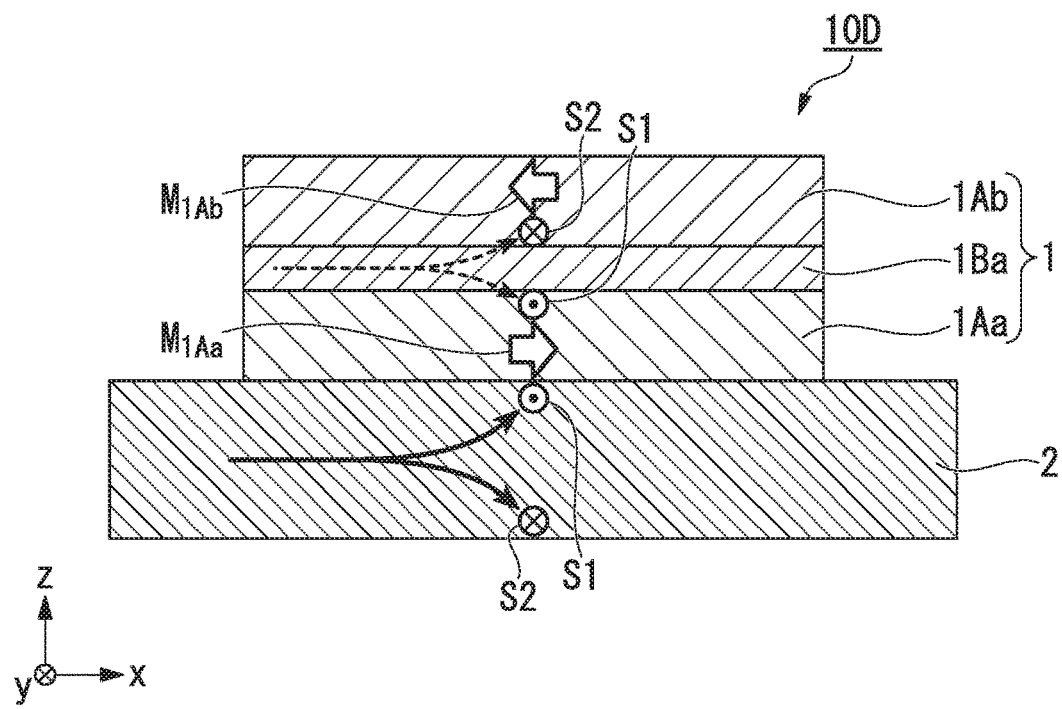

FIGS. 4A and 4B are diagrams schematically showing an example of a spin current magnetization rotational element in the case where the ferromagnetic constituent layers 1Aa and 1Ab are in-face magnetized films and the magnetizations $M_{1Aa}$ and $M_{1Ab}$ are oriented in the x direction. In the spin current magnetization rotational element 10C shown in FIG. 4A, the ferromagnetic constituent layer 1Aa and the ferromagnetic constituent layer 1Ab are ferromagnetically coupled, and the spin current magnetization rotational element 10D shown in FIG. 4B, the ferromagnetic constituent layer 1Aa and the ferromagnetic constituent layer 1Ab are anti-ferromagnetically coupled.

Also in this case, the direction of spin (±Y directions) to be injected is orthogonal to the orientation direction (x direction) of the magnetizations $M_{1Aa}$, $M_{1Ab}$ of the ferromagnetic constituent layers 1Aa, 1Ab. Therefore, the SOT due to the injected spin exerts a force of rotating the magnetizations $M_{1Aa}$, $M_{1Ab}$ by 90° in the ±y direction. Therefore, it is not a problem that the directions of the spins (first spin S1) injected into the ferromagnetic constituent layer 1Aa and the spins (second spin S2) injected into the ferromagnetic constituent layer 1Ab are opposite. The spin (the first spin S1) injected into the ferromagnetic constituent layer 1Aa generates a force to rotate the magnetization $M_{1Aa}$ in the −y direction to advance the magnetization reversal, and the spin (the first spin S1) generates a force to rotate the magnetization $M_{1Ab}$ in the +y direction and advances the magnetization inversion. This is irrespective of whether the ferromagnetic constituent layers 1Aa and 1Ab are ferromagnetically coupled or antiferromagnetically coupled.

Figure 5A:
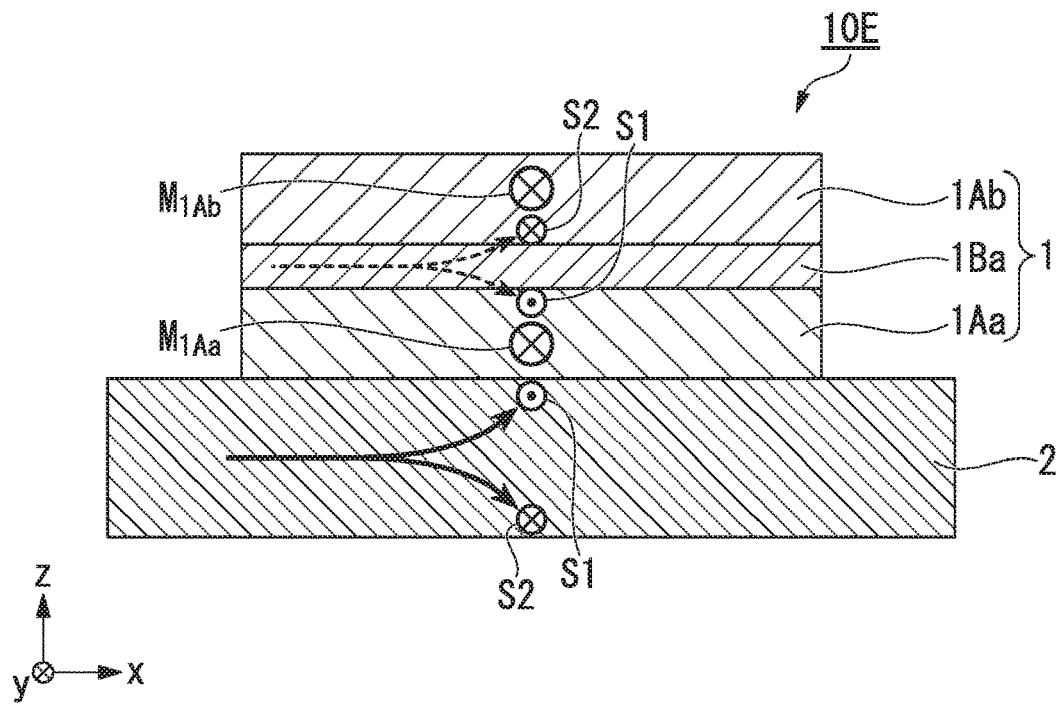
FIGS. 5A and 5B are diagrams schematically showing a spin current magnetization rotational element of an example in which the ferromagnetic constituent layers are an in-face magnetization film and the magnetization thereof is oriented in the y direction.
Figure 5B:
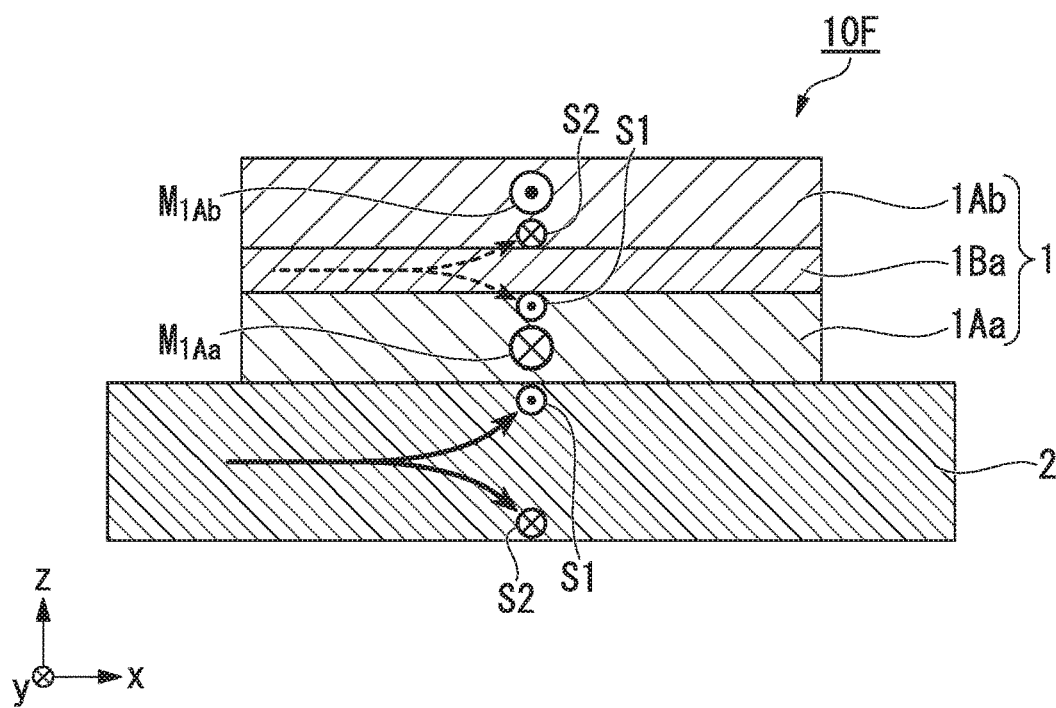

FIGS. 5A and 5B are views schematically showing an example of a spin current magnetization rotational element in the case where the ferromagnetic constituent layers 1Aa and 1Ab are in-face magnetization films and the magnetizations $M_{1Aa}$ and $M_{1Ab}$ are oriented in the y direction. In the spin current magnetization rotational element 10E shown in FIG. 5A, the ferromagnetic constituent layer 1Aa and the ferromagnetic constituent layer 1Ab are ferromagnetically coupled, and the spin current magnetization rotational element 10F shown in FIG. 5B, the ferromagnetic constituent layer 1Aa and the ferromagnetic constituent layer 1Ab are anti-ferromagnetically coupled.

In this case, the direction of spin (±Y direction) to be injected matches with the orientation direction (y direction) of the magnetizations $M_{1Aa}$, $M_{1Ab}$ of the ferromagnetic constituent layers 1Aa, 1Ab. Therefore, the behavior of magnetization rotation (reversal) is different from the two patterns described above.

As shown in FIG. 5A, a spin (first spin S1) oriented in the −y direction is injected into the ferromagnetic constituent layer 1Aa having the magnetization $M_{1Aa}$ oriented in the +y direction. The injected spin exerts a force (SOT) to rotate the magnetization $M_{1Aa}$ oriented in the +y direction by 180°. Therefore, the magnetization $M_{1Aa}$ of the ferromagnetic constituent layer 1Aa is magnetized in the −y direction. In this case, since it is reversed only by the rotating force, it is possible to reverse the magnetization in a non-magnetic field. On the other hand, spin (second spin S2) oriented in the +y direction is injected into the ferromagnetic constituent layer 1Ab having the magnetization $M_{1Ab}$ which is oriented in the +y direction. For injected spin, a force (SOT) acts in a direction to maintain the magnetization $M_{1Ab}$ that is oriented in the +y direction.

As described above, in the case of the configuration shown in FIG. 5A, the direction of the spin (the first spin S1) injected into the ferromagnetic constituent layer 1Aa and the spin (the second spin S2) injected into the ferromagnetic constituent layer 1Ab are opposite, which causes a problem. In the ferromagnetic constituent layer 1Aa, the SOT acts in a direction to promote the magnetization reversal of the magnetization $M_{1Aa}$, whereas in the ferromagnetic constituent layer 1Ab, the SOT acts in a direction inhibiting the magnetization reversal of the magnetization $M_{1Ab}$.

On the other hand, the ferromagnetic constituent layer 1Aa and the ferromagnetic constituent layer 1Ab are magnetically coupled. The force for changing the magnetization direction by magnetic coupling is larger than the force for changing the magnetization direction by SOT. If the magnetization $M_{1Aa}$ of the ferromagnetic constituent layer 1Aa reverses magnetization, even if magnetization reversal of the magnetization $M_{1Ab}$ is somewhat hindered by SOT, the magnetization $M_{1Ab}$ of the ferromagnetic constituent layer 1Ab is magnetization-reversed. That is, also in the case of the configuration of FIG. 5A, magnetization rotation (reversal) easily occurs in the entire first ferromagnetic layer 1.

On the other hand, in the spin current magnetization rotational element 10F shown in FIG. 5B, spin (the first spin S1) oriented in the −y direction is injected into the ferromagnetic constituent layer 1Aa having the magnetization $M_{1Aa}$ oriented in the y direction. In addition, spin (the second spin S2) oriented in the +y direction is injected into the ferromagnetic constituent layer 1Ab having the magnetization $M_{1Ab}$ in the −y direction. That is, in any of the ferromagnetic constituent layers 1Aa and 1Ab, a force (SOT) for rotating the magnetizations $M_{1Aa}$ and $M_{1Ab}$ by 180° is applied.

Even in the case where the magnetizations $M_{1Aa}$ and $M_{1Ab}$ of the ferromagnetic constituent layers 1Aa and 1Ab are oriented in any direction (FIG. 3A to FIG. 5B), it is preferable that the ferromagnetic constituent layer 1Aa and the ferromagnetic constituent layer 1Ab are antiferromagnetically coupled. By antiferromagnetic coupling, the leakage magnetic field from the first ferromagnetic layer 1 can be suppressed. In addition, when the magnetizations $M_{1Aa}$ and $M_{1Ab}$ are oriented in they direction, it is preferable that the ferromagnetic constituent layer 1Aa and the ferromagnetic constituent layer 1Ab are antiferromagnetically coupled, since the reversal current density can be particularly reduced.

As described above, in the spin current magnetization reversal devices 10A to 10F according to the first embodiment, magnetization reversal is promoted irrespective of the relationship between: the directions of the spins injected into the ferromagnetic constituent layers 1Aa and 1Ab; and the directions of the magnetizations $M_{1Aa}$ and $M_{1Ab}$ of the ferromagnetic constituent layers 1Aa and 1Ab. That is, according to the spin current magnetization rotational elements 10A to 10F of the first embodiment, it is possible to develop a large SOT with a small amount of current and to lower the reversal current density.

In the spin current magnetization rotational element according to the first embodiment, the first ferromagnetic layer 1 has a plurality of interfaces therein. That is, in the spin current magnetization rotational element according to the first embodiment, spin current caused by the interface Rashba effect also acts, so that magnetization reversal occurs more efficiently.

Although the detailed mechanism of the interface Rashba effect is not clear, it is believed as follows. At the interface between dissimilar materials, the spatial inversion symmetry is broken, and the potential gradient exists in the direction perpendicular to the plane. When an electric current flows along such an interface with a potential gradient in the direction perpendicular to the surface, in other words, when electrons move in a two-dimensional plane, the effective magnetic field acts on the spin in the direction perpendicular to the direction of movement of electrons and in the in-face direction. Then, the directions of the spins are aligned in the direction of the effective magnetic field. As a result, spin accumulation is formed at the interface. And this spin accumulation produces a pure spin current diffusing out of plane. This pure spin current also contributes to magnetization rotation (reversal).

The spin current magnetization rotational element according to the first embodiment can be applied to a nonvolatile random access memory (MRAM), a high frequency component, a magnetic sensor, and the like. Further, for example, it can be used alone as a magnetic anisotropic sensor, an optical element utilizing the magnetic Kerr effect or the magnetic Faraday effect.

(Spin Current Magnetization Inversion Element)

Second Embodiment

Figure 6:
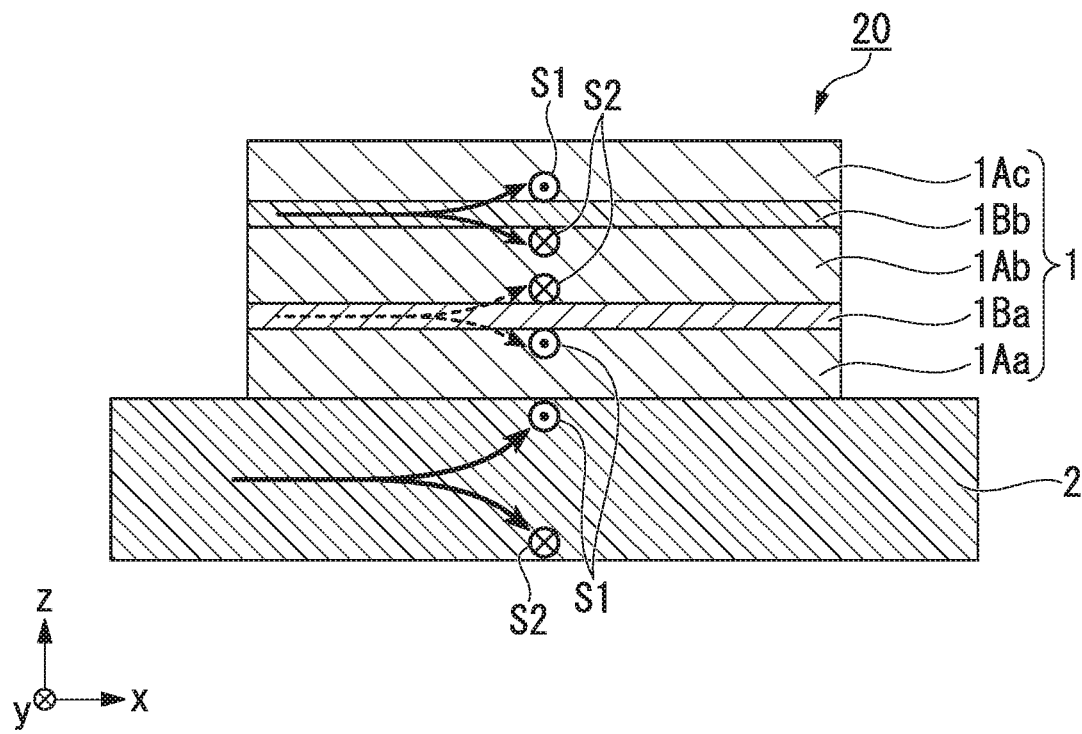
FIG. 6 is a schematic cross-sectional view of a spin current magnetization rotational element according to the second embodiment.

FIG. 6 is a schematic cross-sectional view of the spin current magnetization rotational element 20 according to the second embodiment. The spin current magnetization rotational element 20 according to the second embodiment is different from the spin current magnetization rotational element 10 according to the first embodiment in that the inserted layers 1Ba and 1Bb are two layers. The other configurations are the same as those of the spin current magnetization rotational element 10 according to the first embodiment, and the same configuration is denoted by the same reference numeral, and the explanation thereof will be omitted.

In the spin current magnetization rotational element 20 shown in FIG. 6, the polarities of the spin-orbit torque wires 2 and the spin Hall angles of the inserted layers 1Ba and 1Bb are alternately different in the lamination direction. Therefore, the directions of the spins injected into the ferromagnetic constituent layers 1Aa, 1Ab, 1Ac are aligned. Therefore, magnetization rotation (reversal) can be efficiently performed in any of the ferromagnetic constituent layers 1Aa, 1Ab, 1Ac.

Figure 7A:
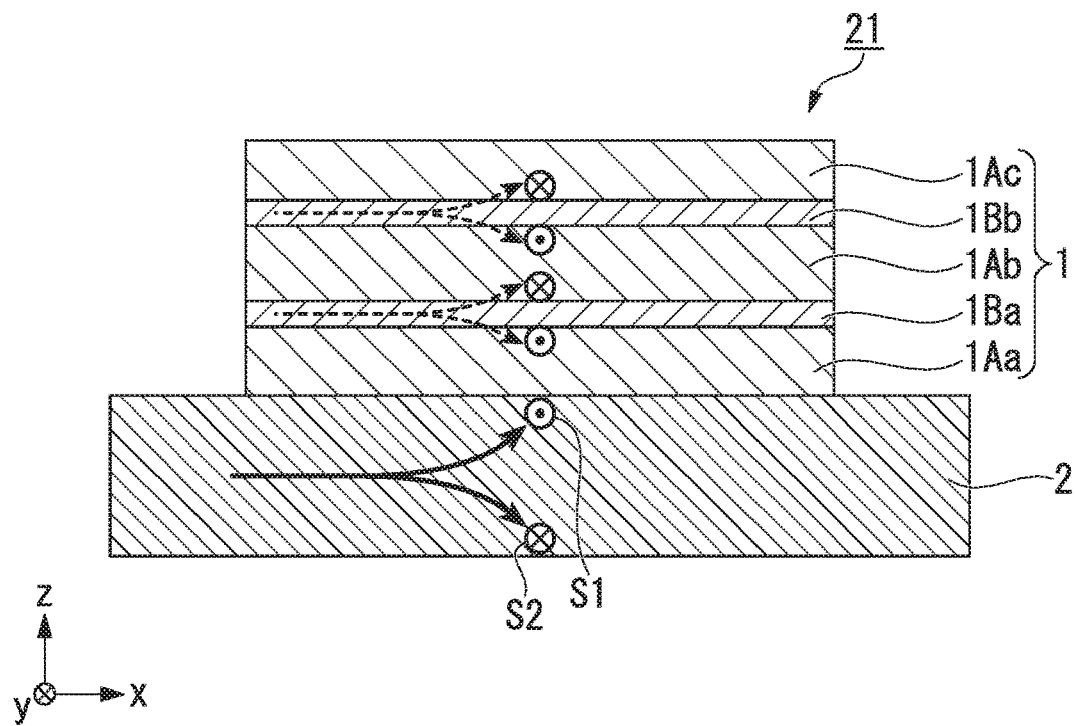
FIGS. 7A and 7B are schematic cross-sectional views of another example of a spin current magnetization rotational element according to the second embodiment.
Figure 7B:
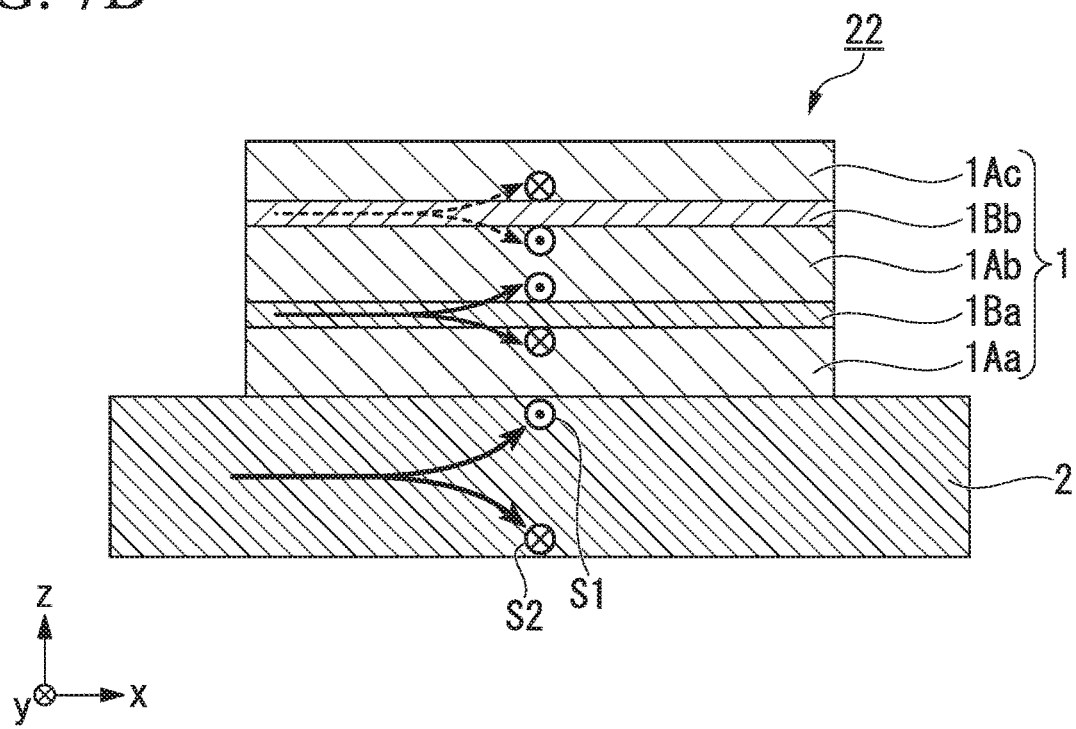

Each ferromagnetic constituent layer 1Aa, 1Ab, 1Ac is magnetically coupled to an adjacent ferromagnetic constituent layer. Therefore, the directions of the spins injected into all the ferromagnetic constituent layers are not necessarily uniform. FIGS. 7A and 7B are schematic cross-sectional views of another example of the spin current magnetization rotational element according to the second embodiment.

In the spin current magnetization rotational element 21 shown in FIG. 7A, the polarities of the spin Hall angles of the spin-orbit torque wiring 2 sandwiching the ferromagnetic constituent layer 1Aa and the inserted layer 1Ba are different. Therefore, the magnetization of the ferromagnetic constituent layer 1Aa is efficiently rotated (reversed). The magnetizations of the ferromagnetic constituent layers 1Ab and 1Ac are efficiently rotated (reversed) by magnetic coupling with the ferromagnetic constituent layer 1Aa.

In the spin current magnetization rotational element 22 shown in FIG. 7B, the polarities of the spin Hall angles of the two inserted layers 1Ba and 1Bb sandwiching the ferromagnetic constituent layer 1Ab are different. Therefore, the magnetization of the ferromagnetic constituent layer 1Ab is efficiently rotated (reversed). The magnetizations of the ferromagnetic constituent layers 1Aa and 1Ac are efficiently rotated (reversed) by magnetic coupling with the ferromagnetic constituent layer 1Aa.

Also in the spin current magnetization rotational element 20 according to the second embodiment, the orientation direction of magnetization of the ferromagnetic constituent layers 1Aa, 1Ab, 1Ac is not particularly limited. The magnetic coupling between the adjacent ferromagnetic constituent layers 1Aa, 1Ab and 1Ac may be ferromagnetic coupling or antiferromagnetic coupling. For example, the ferromagnetic constituent layer 1Aa and the ferromagnetic constituent layer 1Ab may be ferromagnetically coupled, and the ferromagnetic constituent layer 1Ab and the ferromagnetic constituent layer 1Ac may be anti-ferromagnetically coupled.

When the magnetization directions of the ferromagnetic constituent layers 1Aa, 1Ab, 1Ac are oriented in the y direction, it is preferable that at least two ferromagnetic constituent layers of the adjacent ferromagnetic constituent layers 1Aa, 1Ab, 1Ac are antiferromagnetically coupled.

Further, in the plurality of ferromagnetic constituent layers, it is preferable that the sum of the products of the saturation magnetization and the film thickness of the ferromagnetic constituent layers, in which the magnetization is oriented in the same direction, equals to the sum of the saturation magnetization and the film thickness of the ferromagnetic constituent layers, in which the magnetization is oriented in the opposite direction. For example, when the magnetizations of the ferromagnetic constituent layers 1Aa and 1Ac are oriented in the same direction and the magnetizations of the ferromagnetic constituent layer 1Ab are oriented in opposite directions, it is preferable that the relationship of $(H_{1Aa} \times t_{1Aa}) + (H_{1Ac} \times t_{1Ac}) = H_{1Ab} \times t_{1Ab}$ is satisfied. Here, $H_{1Aa}$, $H_{1Ab}$ and $H_{1Ac}$ are the saturation magnetizations of the ferromagnetic constituent layers 1Aa, 1Ab and 1Ac, respectively. In addition, $t_{1Aa}$, $t_{1Ab}$ and $t_{1Ac}$ are the thicknesses of the ferromagnetic constituent layers 1Aa, 1Ab and 1Ac, respectively. By satisfying the above-described relationship, the leakage magnetic field from the first ferromagnetic layer 1 can be suppressed.

As described above, in the spin current magnetization rotational element 20 according to the second embodiment, at least one ferromagnetic constituent layer is sandwiched by layers having different spin Hole angles, whereby the magnetization of the ferromagnetic constituent layer can be efficiently rotated (reversed). Further, since the other ferromagnetic constituent layers are magnetically coupled with this ferromagnetic structure, the magnetization rotates (reverses) efficiently. As a result, the magnetization direction of the first ferromagnetic layer 1 as a whole changes efficiently. That is, according to the spin current magnetization rotational element 20 of the second embodiment, a large SOT can be expressed with a small amount of current, and the reversal current density can be lowered.

In FIG. 6 and FIGS. 7A and 7B, the case where the inserted layers 1Ba and 1Bb are two layers is described as an example, but the number of inserted layers may be more than two. Also in this case, it is preferable that the above-described relationship is satisfied.

(Spin-Orbital Torque Type Magnetoresistance Element)

Third Embodiment

Figure 8:
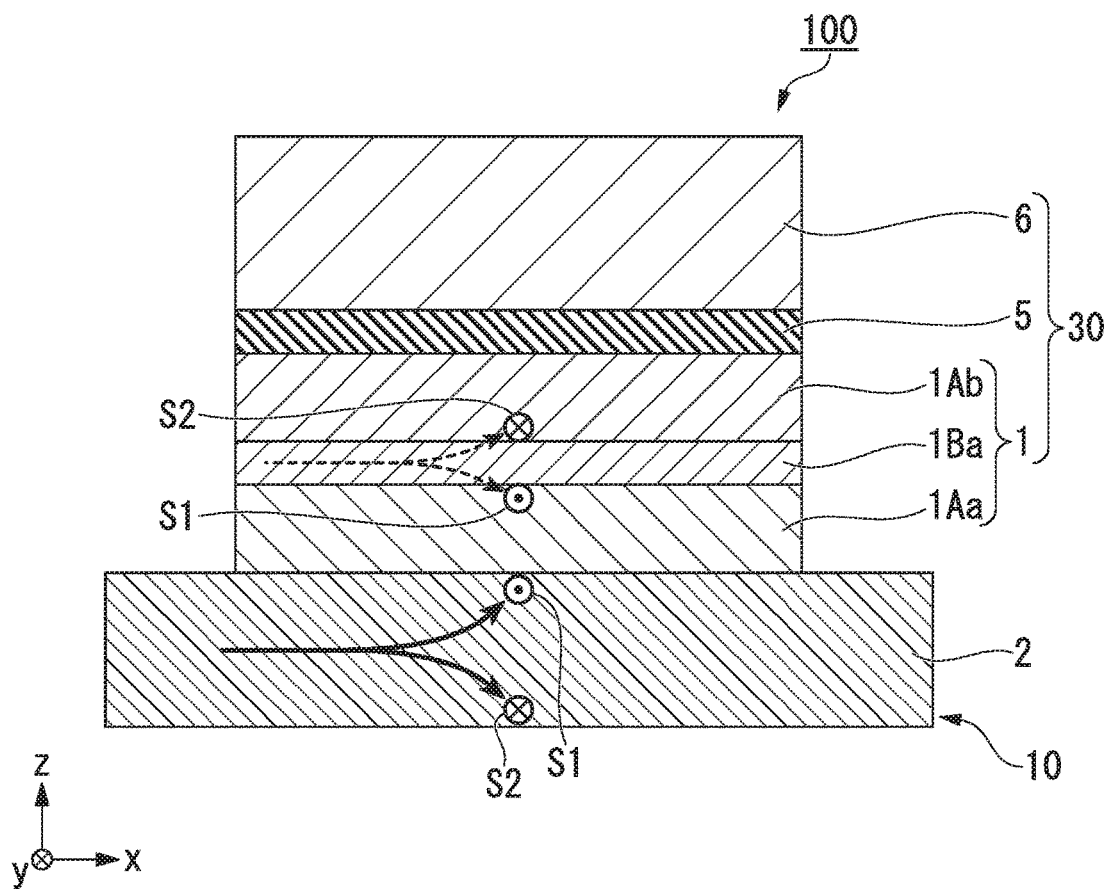
FIG. 8 is a schematic cross-sectional view of a spin-orbit torque magnetoresistance effect element according to the third embodiment.

FIG. 8 is a schematic sectional view of the spin-orbit torque magnetoresistance effect element 100 according to the third embodiment. The spin-orbit torque magnetoresistance effect element 100 shown in FIG. 8 includes a spin current magnetization rotational element 10 according to the first embodiment, a non-magnetic layer 5, and a second ferromagnetic layer 6. The spin current magnetization rotational element 10 may be a spin current magnetization rotational element according to the second embodiment. A description of the configuration equivalent to that of the spin current magnetization rotational element 10 of the first embodiment will be omitted.

A laminated body (functional unit 30) in which the first ferromagnetic layer 1, the non-magnetic layer 5, and the second ferromagnetic layer 6 are laminated functions in the same manner as a normal magnetoresistance effect element. The functional unit 30 functions by the magnetization of the second ferromagnetic layer 6 being fixed in one direction (z direction) and the magnetization direction of the first ferromagnetic layer 1 being relatively changed. Here, the change in the resistance value of the functional unit 30 depends on the relative angle of the magnetization of the two ferromagnetic layers sandwiching the non-magnetic layer 5. Thus, the magnetization direction of the first ferromagnetic layer 1 means the magnetization direction of the ferromagnetic constituent layer 1Ab closest to the non-magnetic layer 5 side.

When applied to a coercive force difference type (pseudo spin valve type) MRAM, the coercive force of the second ferromagnetic layer 6 is made larger than the coercive force of the first ferromagnetic layer 1. When applied to an exchange bias type (spin valve type) MRAM, the magnetization M6 of the second ferromagnetic layer 6 is fixed by exchange coupling with the antiferromagnetic layer.

In the case where the non-magnetic layer 5 is made of an insulator, the functional unit 30 has the same structure as the tunneling magnetoresistance (TMR) element. In the case where the non-magnetic layer 5 is made of a metal, it is a giant magnetoresistance (GMR) element.

A laminated structure of the known magnetoresistance effect element can be adopted as the laminated structure of the functional section 30. For example, each layer may be composed of a plurality of layers, or may be provided with another layer such as an antiferromagnetic layer for fixing the magnetization direction of the second ferromagnetic layer 6. The second ferromagnetic layer 6 is called a fixed layer or a reference layer, and the first ferromagnetic layer 1 is called a free layer, a memory layer, or the like.

For the material of the second ferromagnetic layer 6, a known material can be used. For example, a metal selected from the group consisting of Cr, Mn, Co, Fe and Ni and alloys exhibiting ferromagnetism containing at least one of these metals can be used. An alloy containing these metals and at least one element of B, C, and N can be used. Specifically, Co—Fe and Co—Fe—B can be mentioned.

In order to obtain a higher output, it is preferable to use a Heusler alloy such as $Co_2FeSi$ for the material of the second ferromagnetic layer 6. The Heusler alloy contains an intermetallic compound having a chemical composition of $X_2YZ$, X is a transition metal element or a noble metal element of Co, Fe, Ni, or Cu group on the periodic table, Y is a transition metal element of Mn, V, Cr, or Ti group or an elemental species of X, and Z is a typical element of group III to group V For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like can be named.

An antiferromagnetic material such as IrMn or PtMn may be used as a material in contact with the second ferromagnetic layer 6 in order to further increase the coercive force of the second ferromagnetic layer 6 with respect to the first ferromagnetic layer 1. Furthermore, in order to prevent the leakage magnetic field of the second ferromagnetic layer 6 from affecting the first ferromagnetic layer 1, a synthetic ferromagnetic coupling structure may be adopted.

For the non-magnetic layer 5, a known material can be used.

For example, when the non-magnetic layer 5 is made of an insulator (in the case of a tunnel barrier layer), $Al_2O_3$, $SiO_2$, MgO, $MgAl_2O_4$, or the like can be used as a material thereof. In addition to these materials, a material in which a part of Al, Si, Mg is substituted with Zn, Be or the like can also be used. Among them, since MgO and $MgAl_2O_4$ are materials that can realize coherent tunneling, spin can be efficiently injected. When the non-magnetic layer 5 is made of a metal, Cu, Au, Ag, or the like can be used as the material thereof. Further, when the non-magnetic layer 5 is made of a semiconductor, Si, Ge, $CuInSe_2$, $CuGaSe_2$, $Cu(In, Ga)Se_2$ or the like can be used as a material thereof.

The functional unit 30 may have other layers. The underlying layer may be provided on the surface of the first ferromagnetic layer 1 opposite to the non-magnetic layer 5. It is preferable that the layer disposed between the spin-orbit torque wiring 2 and the first ferromagnetic layer 1 does not dissipate the spin propagating from the spin-orbit torque wiring 2. For example, it is known that silver, copper, magnesium, aluminum, etc. have a long spin diffusion length of 100 nm or more, and spin hardly dissipates. Further, the thickness of this layer is preferably not more than the spin diffusion length of the material constituting the layer. If the thickness of the layer is equal to or less than the spin diffusion length, the spin propagating from the spin-orbit torque wiring 2 can be sufficiently transmitted to the first ferromagnetic layer 1.

Since the spin-orbit torque magnetoresistance effect element 100 according to the third embodiment includes the above-described spin current magnetization rotational element, it is possible to efficiently rotate (reverse) the magnetization direction of the first ferromagnetic layer 1. That is, according to the spin-orbit torque magnetoresistance effect element 100 according to the third embodiment, a large SOT can be expressed with a small amount of current, and the reversal current density can be lowered.

(Production Method)

Productions methods of the above-described spin current magnetization rotational element and the magnetoresistance effect element including the spin current magnetization rotational element are not particularly limited, and a known film formation method can be used. As the film formation method, for example, resistance heating deposition, electron beam evaporation, molecular beam epitaxy (MBE), ion plating, ion beam deposition, sputtering or the like can be used as a physical vapor deposition (PVD) method. As a chemical vapor deposition (CVD) method, a thermal CVD method, a photo CVD method, a plasma CVD method, a metal organic chemical vapor deposition (MOCVD) method, an atomic layer deposition (ALD) method, or the like can also be used. Furthermore, a monoatomic layer doping method (delta doping method) can be used to form an ultrathin (an atomic radius not more than twice) inserted layer.

The spin-orbit torque wiring 2 and the first ferromagnetic metal layer 1 can be formed, for example, by using a magnetron sputtering apparatus. After the film formation, a resist or a protective film is placed on the portion where the spin current magnetization rotational element is to be formed, and unnecessary portions are removed by ion milling method or reactive ion etching (RIE) method.

In the case where the functional unit 30 of the spin-orbit torque magnetoresistance effect element 100 is a TMR element, the non-magnetic layer 5 may be laminated using a target made of an oxide; or the non-magnetic layer 5 may be formed by oxidation after the metal layer is laminated. In the case of oxidizing the metal layer after lamination, firstly a metal thin film of magnesium, aluminum and divalent cations of a plurality of non-magnetic elements of about 0.4 nm to 2.0 nm is first formed on the first ferromagnetic metal layer by sputtering. Then, natural oxidation is performed by plasma oxidation or oxygen introduction, and the non-magnetic layer 5 is formed by a subsequent heat treatment.

It is preferable that the obtained laminated film (functional unit 30) is annealed. The layer formed by reactive sputtering is amorphous and needs to be crystallized. For example, when Co—Fe—B is used as the ferromagnetic metal layer, a part of B is crystallized by being annealed.

The magnetoresistance effect element manufactured by annealing improves the magnetoresistance ratio as compared with the magnetoresistance effect element manufactured without annealing treatment. It is considered that the uniformity and the orientation of the crystal size of the non-magnetic layer 5 are improved by the annealing treatment.

As the annealing treatment, heating is performed in an inert atmosphere such as Ar at a temperature of 300° C. or more and 500° C. or less for 5 minutes or more and 100 minutes or less, and then a magnetic field of 2 kOe or more and 10 kOe or less is applied, Or more and 500° C. or less, for 1 hour to 10 hours.

As a method of making the functional unit 30 into a predetermined shape, processing means such as photolithography can be used. First, after laminating the layers to be the functional unit 30, a resist is applied to the surface of the layer to be the functional unit 30 on the side opposite to the spin-orbit torque wiring 2. Then, a predetermined portion of the resist is cured, and the unnecessary portion of the resist is removed. The portion where the resist is cured becomes the protective film of the functional unit 30. The portion where the resist is cured is substantially in agreement with the shape of the finally obtained functional unit 30.

Then, processing such as ion milling and reactive ion etching (RIE) is performed on the surface on which the protective film is formed. The portion where the protective film is not formed is removed, and a magnetoresistance effect element of a predetermined shape is obtained.

Fourth Embodiment

<Magnetic Memory>

Figure 9:
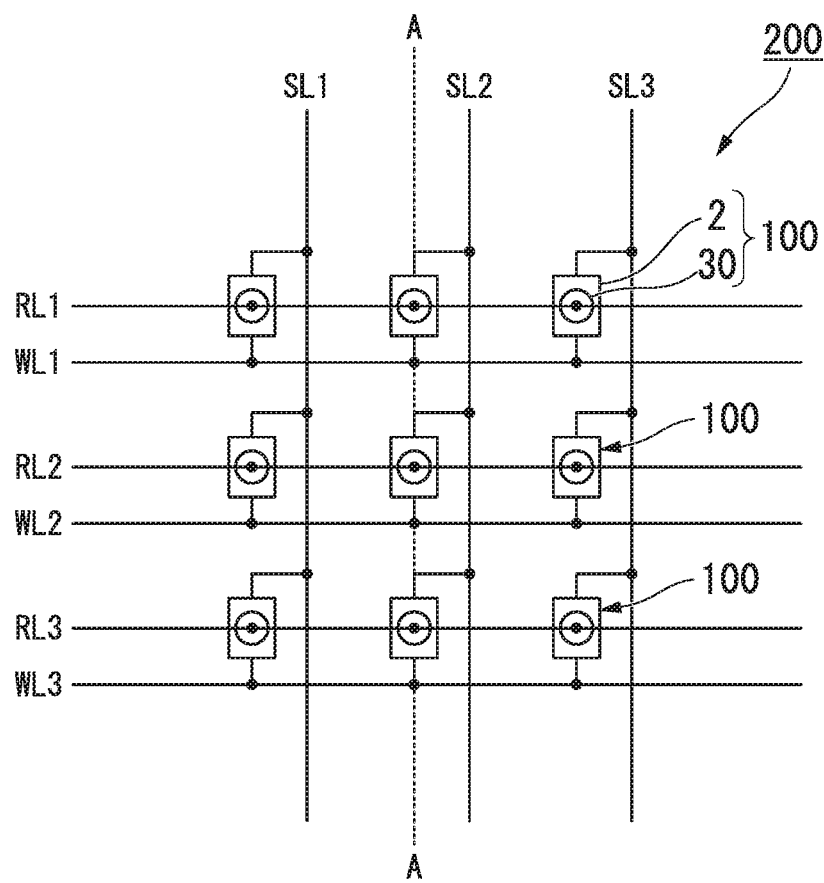
FIG. 9 is a plan view of a magnetic memory including a plurality of spin-orbit torque magnetoresistance effect elements.

FIG. 9 is a plan view of a magnetic memory 200 including a plurality of spin-orbit torque type magnetoresistance effect elements 100 (see FIG. 8). FIG. 8 corresponds to a cross-sectional view of the spin-orbit torque magnetoresistance effect element 100 cut along the A-A plane in FIG. 9. In the magnetic memory 200 shown in FIG. 9, the spin-orbit torque magnetoresistance effect element 100 has a 3×3 matrix arrangement. FIG. 9 is an example of a magnetic memory, and the number and arrangement of the spin-orbit torque magnetoresistance effect elements 100 are arbitrary.

Each of one word line, which is one of WL1 to WL3; one source line, which is one of SL1 to SL3; and one lead line, which is one of RL1 to RL3, is connected to the spin-orbit torque magnetoresistance effect element 100.

By selecting the word lines WL1 to WL3 to which current is applied; and the source lines SL1 to SL3, current flows in the spin-orbit torque wiring 2 of an arbitrary spin-orbit torque type magnetoresistance effect element 100 to perform a write operation. In addition, by selecting the lead lines RL1 to RL3 to which current is applied and the source lines SL1 to SL3, current flows in the stacking direction of the functional unit 60 of an arbitrary spin-orbit torque magnetoresistance effect element 100, and a reading operation is performed. The word lines WL1 to WL3 and the source lines SL1 to SL3 to which current is applied; and the read lines RL1 to RL3 can be selected by transistors or the like. That is, by reading out data of an arbitrary element from the plurality of spin-orbit torque magnetoresistance effect elements 100, it can be utilized as a magnetic memory.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: First ferromagnetic layer
1Aa, 1Ab, 1Ac: Ferromagnetic constituent layer
1Ba, 1Bb: Inserted layer
2: Spin-orbit torque wiring
5: Non-magnetic layer
6: Second ferromagnetic layer
10, 10A, 10B, 10C, 10D, 10E, 10F, 11, 20, 21, 22: Spin current magnetization rotational element
30: Functional unit
100: Spin-orbit torque magnetoresistance effect element
200: Magnetic memory
S1: First spin
S2: Second spin

What is claimed is:

1. A spin current magnetization rotational element comprising:
a spin-orbit torque wiring configured such that current flows through the spin-orbit torque wiring in a first direction; and
a first ferromagnetic layer on the spin-orbit torque wiring, wherein:
the first ferromagnetic layer comprises stacked layers of a plurality of ferromagnetic constituent layers and at least one layer constituted to generate spin current sandwiched between adjacent layers of the plurality of ferromagnetic constituent layers;
the stacked layers are stacked in a second direction that intersects the first direction;
polarities of spin Hall angles of the spin-orbit torque wiring and one of the at least one layer constituted to generate spin current, which sandwich at least one of the plurality of ferromagnetic constituent layers, differ; and
a magnetization direction of the ferromagnetic constituent layers is oriented in the first direction or the second direction.

2. The spin current magnetization rotational element according to claim 1, wherein
the first ferromagnetic layer comprises a plurality of inserted layers, and
polarities of spin Hall angles of the spin-orbit torque wiring and the plurality of inserted layers alternately differ in a lamination direction thereof.

3. The spin current magnetization rotational element according to claim 1, wherein
one of (I-i) and (II-i) below is satisfied,
(I-i) in a case where the spin-orbit torque wiring has a spin Hall angle of a positive polarity and the one of the at least one layer constituted to generate spin current has a spin Hall angle of a negative polarity, the spin-orbit torque wiring includes a metal element belonging to any one of groups 8, 9, 10, 11 and 12 as a major component, and the one of the at least one layer constituted to generate spin current includes a metal element belonging to any one of groups 3, 4, 5 and 7 as a major component,
(II-i) in a case where the spin-orbit torque wiring has a spin Hall angle of a negative polarity and the one of the at least one layer constituted to generate spin current has a spin Hall angle of a positive polarity, the spin-orbit torque wiring includes a metal element belonging to any one of groups 3, 4, 5, 6 and 7 as a major component, and the one of the at least one layer constituted to generate spin current includes a metal element belonging to any one of groups 10, 11 and 12 as a major component.

4. The spin current magnetization rotational element according to claim 1, wherein the adjacent layers of the plurality of ferromagnetic constituent layers are antiferromagnetically coupled.

5. The spin current magnetization rotational element according to claim 4, wherein the magnetization direction of the ferromagnetic constituent layers is oriented in the first direction.

6. The spin current magnetization rotational element according to claim 1, wherein
in the plurality of ferromagnetic constituent layers, a sum of products of saturation magnetizations and layer thicknesses of ferromagnetic constituent layers, magnetization directions of which are oriented in an identical direction, equals to a sum of products of saturation magnetizations and layer thicknesses of ferromagnetic constituent layers, magnetization directions of which are oriented in an opposite direction.

7. The spin current magnetization rotational element according to claim 1, wherein the film thickness of the each of the plurality of ferromagnetic constituent layers is 1.0 nm or less.

8. The spin current magnetization rotational element according to claim 1, wherein one of (I-ii) and (II-ii) below is satisfied,
(I-ii) in a case where the spin-orbit torque wiring has a spin Hall angle of a positive polarity and the one of the at least one layer constituted to generate spin current has a spin Hall angle of a negative polarity, the spin-orbit torque wiring includes a metal element belonging to any one of groups 8, 9 and 12 as a major component, and the one of the at least one layer constituted to generate spin current includes a metal element belonging to any one of groups 3, 4, 5, 6 and 7 as a major component,
(II-ii) in a case where the spin-orbit torque wiring has a spin Hall angle of a negative polarity and the one of the at least one layer constituted to generate spin current has a spin Hall angle of a positive polarity, the spin-orbit torque wiring includes a metal element belonging to any one of groups 3, 4 and 7 as a major component, and the one of the at least one layer constituted to generate spin current includes a metal element belonging to any one of groups 8, 9, 10, 11 and 12 as a major component.

9. The spin current magnetization rotational element according to claim 1, wherein the adjacent ferromagnetic constituent layers are coupled by ferromagnetic coupling or antiferromagnetic coupling.

10. The spin current magnetization rotational element according to claim 1, wherein:
among the plurality of ferromagnetic constituent layers, a ferromagnetic constituent layer closest to the spin-orbit torque wiring is thinner than any one of other ferromagnetic constituent layers; and
a film thickness of each of the plurality of ferromagnetic constituent layers is 1.5 nm or less.

11. A spin-orbit torque magnetoresistance effect element comprising:
the spin current magnetization rotational element according to claim 1;
a non-magnetic layer laminated on a surface of the first ferromagnetic layer on an opposite side of a surface contacting the spin-orbit torque wiring; and
a second ferromagnetic layer, the first ferromagnetic layer and the non-magnetic layer being sandwiched between the second ferromagnetic layer and the spin-orbit torque wiring.

12. A magnetic memory comprising a plurality of spin-orbit torque magnetoresistance effect elements according to claim 11.

13. A spin current magnetization rotational element comprising:

a spin-orbit torque wiring extending in a first direction; and
a first ferromagnetic layer extending in a second direction intersecting with the first direction, wherein
the first ferromagnetic layer comprises a plurality of internal layers including:
a plurality of ferromagnetic constituent layers; and
at least one layer constituted to generate spin current sandwiched between adjacent ferromagnetic constituent layers,
polarities of spin Hall angles of the spin-orbit torque wiring and one of the at least one layer constituted to generate spin current, which sandwich one of the plurality of ferromagnetic constituent layers, differ,
one of (I) and (II) below is satisfied,
(I) in a case where the spin-orbit torque wiring has a spin Hall angle of a positive polarity and the one of the at least one layer constituted to generate spin current has a spin Hall angle of a negative polarity, the spin-orbit torque wiring includes a metal element belonging to any one of groups 8, 9, 10, 11 and 12 as a major component, and the one of at least one layer constituted to generate spin current includes a metal element belonging to any one of groups 3, 4, 5, 6 and 7 as a major component,
(II) in a case where the spin-orbit torque wiring has a spin Hall angle of a negative polarity and the one of the at least one layer constituted to generate spin current has a spin Hall angle of a positive polarity, the spin-orbit torque wiring includes a metal element belonging to any one of groups 3, 4, 5, 6 and 7 as a major component, and the one of the at least one layer constituted to generate spin current includes a metal element belonging to any one of groups 8, 9, 10, 11 and 12 as a major component,
polarities of spin Hall angles of the spin-orbit torque wiring and the plurality of internal layers alternate in a lamination direction of the spin-orbit torque wiring and the plurality of internal layers,
among the plurality of ferromagnetic constituent layers, a ferromagnetic constituent layer closest to the spin-orbit torque wiring is thinner than any one of other ferromagnetic constituent layers, and
a magnetization direction of the ferromagnetic constituent layers is oriented to a third direction perpendicular to the first and second directions.

14. The spin current magnetization rotational element according to claim 13, wherein
the first ferromagnetic layer comprises a plurality of inserted layers, and
polarities of spin Hall angles of the spin-orbit torque wiring and the plurality of inserted layers alternately differ in a lamination direction thereof.

15. The spin current magnetization rotational element according to claim 13, wherein the adjacent layers of the plurality of ferromagnetic constituent layers are antiferromagnetically coupled.

16. The spin current magnetization rotational element according to claim 14, wherein at least adjacent two ferromagnetic constituent layers are antiferromagnetically coupled in the plurality of ferromagnetic constituent layers.

17. The spin current magnetization rotational element according to claim 13, wherein one of (I-i) and (II-i) below is satisfied,
(I-i) in a case where the spin-orbit torque wiring has a spin Hall angle of a positive polarity and the one of the at least one layer constituted to generate spin current has a spin Hall angle of a negative polarity, the spin-orbit torque wiring includes a metal element belonging to any one of groups 8, 9, 10, 11 and 12 as a major component, and the one of the at least one layer constituted to generate spin current includes a metal element belonging to any one of groups 3, 4, 5, 6 and 7 as a major component, (II-i) in a case where the spin-orbit torque wiring has a spin Hall angle of a negative polarity and the one of the at least one layer constituted to generate spin current has a spin Hall angle of a positive polarity, the spin-orbit torque wiring includes a metal element belonging to any one of groups 3, 4, 5 and 7 as a major component, and the one of the at least one layer constituted to generate spin current includes a metal element belonging to any one of groups 10, 11 and 12 as a major component.

18. The spin current magnetization rotational element according to claim 13, wherein one of (I-ii) and (II-ii) below is satisfied, (I-ii) in a case where the spin-orbit torque wiring has a spin Hall angle of a positive polarity and the one of the at least one layer constituted to generate spin current has a spin Hall angle of a negative polarity, the spin-orbit torque wiring includes a metal element belonging to any one of groups 8, 9 and 12 as a major component, and the one of the at least one layer constituted to generate spin current includes a metal element belonging to any one of groups 3, 4, 5, 6 and 7 as a major component, (II-ii) in a case where the spin-orbit torque wiring has a spin Hall angle of a negative polarity and the one of the at least one layer constituted to generate spin current has a spin Hall angle of a positive polarity, the spin-orbit torque wiring includes a metal element belonging to any one of groups 3, 4 and 7 as a major component, and the one of the at least one layer constituted to generate spin current includes a metal element belonging to any one of groups 8, 9, 10, 11 and 12 as a major component.

19. The spin current magnetization rotational element according to claim 13, wherein the film thickness of each of the plurality of ferromagnetic constituent layer is 1.0 nm or less.

20. The spin current magnetization rotational element according to claim 13, wherein:
a film thickness of each of the plurality of ferromagnetic constituent layers is 1.5 nm or less; and
the adjacent ferromagnetic constituent layers are coupled by ferromagnetic coupling or antiferromagnetic coupling.

* * * * *